United States Patent [19]

Grundy et al.

[11] Patent Number: 5,224,055
[45] Date of Patent: Jun. 29, 1993

[54] MACHINE FOR CIRCUIT DESIGN

[75] Inventors: David L. Grundy, Saddleworth; Glenn W. Birchby, Manchester; Denzil J. Broadhurst, Oldham, all of United Kingdom

[73] Assignee: Plessey Semiconductors Limited, England

[21] Appl. No.: 576,501
[22] PCT Filed: Feb. 9, 1990
[86] PCT No.: PCT/GB90/00208
§ 371 Date: Nov. 2, 1990
§ 102(e) Date: Nov. 2, 1990
[87] PCT Pub. No.: WO90/09639
PCT Pub. Date: Aug. 23, 1990

[30] Foreign Application Priority Data

Feb. 10, 1989 [GB] United Kingdom ............... 8902982

[51] Int. Cl.$^5$ ............................................. G06F 15/20
[52] U.S. Cl. .................................... 364/488; 364/578
[58] Field of Search .......................... 307/465, 465.1; 324/73.1; 364/488, 489, 490, 580, 578

[56] References Cited

U.S. PATENT DOCUMENTS

| Re. 29,917 | 2/1979 | Kumakawa et al. | 307/465 |
|---|---|---|---|
| 4,307,450 | 12/1981 | Carp et al. | 364/431.05 |
| 4,434,489 | 2/1984 | Blyth | 324/73.1 X |
| 4,441,183 | 4/1984 | Dussault | 324/73.1 X |
| 4,700,293 | 10/1987 | Grone | 324/73.1 X |
| 4,744,084 | 5/1988 | Beck et al. | 324/73.1 X |
| 4,845,633 | 7/1989 | Furtek | 364/490 |

FOREIGN PATENT DOCUMENTS 0372833 6/1990 European Pat. Off. .

OTHER PUBLICATIONS

"Silicon Compilers in an Automated Design Environment" presented at 7th International Conference on Custom & Semi Custom ICs Nov. 3-5, 1987, Penta Hotel, Heathrow, G. W. Birchby and D. J. Wardle.
"Recent Advances in Gate Array Technology", IEE Colloquium The Impact of ASICs on equipment design; Savoy Place, London, Jan. 11, 1988, G. W. Birchby.
"Mixed Analogue and Digital Design–the CDI alternative", Electronic Design Automation Conference, Wembley Conference Centre, Jun. 17-30, 1988, G. W. Birchby.

Primary Examiner—Edward R. Cosimano
Attorney, Agent, or Firm—Kirschstein, Ottinger, Israel & Schiffmiller

[57] ABSTRACT

A machine for circuit design comprising a processor, a configurable logic device and a design tablet device; the processor having a graphics capability and including a display, a design compiler which compiles a graphics representation of the circuit on said display to a set of coded instructions for the setting of the logic device and the design tablet device; wherein the logic device comprises a set of configurable circuit elements in integrated circuit form for providing a hardware representation of some or all of the digital part of the circuit displayed on said display, said coded instructions being operative to control the logic device to appropriately program said circuit elements; and wherein said design tablet device includes a plug board for plugging in discrete electrical components and devices, bus lines coupled to said processor, and wherein said processor is operative to provide appropriate energizing signals to said bus lines to actuate the discrete electrical components and devices.

18 Claims, 12 Drawing Sheets

8 OFF SWITCH CHIP MODULE

SPECIFICATION

| PARAMETER | CONDITIONS | MIN | TYP | MAX | UNITS |
|---|---|---|---|---|---|
| SUPPLY VOLTAGE | | 4.5 | 5 | 5.5 | V |
| SUPPLY CURRENT | Vcm = 2.5V<br>Vout = 2V | | 150 | 300 | µA |
| INPUT OFFSET VOLTAGE | Vcm = 2.5V | | ±2 | ±10 | mV |
| INPUT BIAS CURRENT | Vcm = 2.5V | | 10 | 50 | nA |
| INPUT COMMON MODE RANGE | | 1 | | Vcc-1.3 | V |
| COMMON MODE REJECTION RATIO | | 60 | 70 | | dB |
| OPEN LOOP GAIN | Vcm = 2.5V<br>Vout = 2V<br>Rload = 10k | 10 | 40 | | V/mV |
| OPEN LOOP BANDWIDTH | Vcm = 2.5V<br>Vout = 2V | 10 | 20 | | Hz |
| UNITY GAIN BANDWIDTH | Vcm = 2.5V<br>Vout = 2V | 150 | 250 | | kHz |
| LARGE SIGNAL BANDWIDTH | Vout = 3Vp-p | 40 | 60 | | kHz |
| SLEW RATE | | 0.4 | 0.6 | | V/µS |
| OUTPUT VOLTAGE RANGE | | 0.2 | | Vcc-1.5 | V |
| OUTPUT SOURCE CURRENT | | | 1 | | mA |
| OUTPUT SINK CURRENT | | 60 | 90 | | µA |
| SHORT CIRCUIT OUTPUT CURRENT | | | 5 | 7 | mA |

NOTE: TYPICAL DATA QUOTED AT Vcc = 5V AND Tamb = 25°C

Fig. 9B

MACHINE FOR CIRCUIT DESIGN

BACKGROUND OF THE INVENTION

1. Field of the Invention

This invention relates to the design of electric circuits, and in particular a machine for assisting a designer in the design and development of electric circuits.

2. Description of Related Art

There are currently available custom designed LSI integrated circuits known as ASICs (application specific integrated circuits) or uncommitted logic arrays (ULA—registered trade mark). These are intended for the customers that may require not only digital functions on a chip, but also input/output, and where appropriate, analogue requirements. In order to make optimum use of such ASICs it is necessary to use an effective computer aided design software system (CAD) which is used for system and interconnection design and also verification of the circuits.

Whilst such CAD systems work satisfactorily with digital circuits which can be tested in software form, the use of such systems for designing analogue circuits and mixtures of analogue and digital circuits has proved far more difficult since it is necessary in order adequately to test an analogue circuit to test its operation in the real world. A common method for simplifying the design of analogue circuits is to build a breadboard in which discrete components and standard integrated circuits are hand wired and then coupling the bread board to the real system. This allows digital voltage meters and oscilloscopes to be connected to points of interest and the external switches sensors and displays to be attached.

Thus although the use of ASIC has decreased the need for breadboarding, CAD systems have only previously proved effective where the bulk of the system is digital. When a significant proportion of the system is linear (i.e. analogue), there is no automatic design system currently available which can adequately cope with the entire design problem.

Papers which illustrate the state of the art are as follows:
1. "Silicon Compilers in an Automated Design Environment" Presented at the 7th International Conference on Custom and Semi Custom ICs Nov. 3/5, 1987, Penta Hotel, Heathrow, G. W. Birchby and D. J. Wardle.
2. "Recent Advances in Gate Array Technology" IEE Colloquium "The impact of ASICs on equipment design" Savoy Place, London Jan. 11, 1988, G. W. Birchby.
3. "Mixed Analogue and Digital Design—the CDI Alternative" Electronic Design Automation Conference, Wembley Conference Centre, June 27/30, 1988, G. W. Birchby.

SUMMARY OF THE INVENTION

With a view to overcoming the above noted problem, the present invention provides a machine for circuit design comprising a processor, a configurable logic device and a design tablet device;

the processor having a graphics capability and including a display, a design means which compiles a graphics representation of the circuit on said display to a set of coded instructions for the setting of the logic device and the design tablet device;

wherein the logic device comprises a set of configurable circuit elements in integrated circuit form for providing a hardware representation of some or all of the digital part of the circuit displayed on said display, said coded instructions being operative to control the logic device to appropriately program said circuit elements;

and wherein said design tablet device includes a plug board for plugging in discrete electrical components and devices, bus lines coupled to said processor means, and wherein said processor means is operative to provide appropriate energising signals to said bus lines to actuate the discrete electrical components and devices.

Thus the machine in accordance with the invention provides a comprehensive method of design of a mixed analogue and digital circuit, wherein the digital parts of the circuit are represented in programmable circuit elements and can make use of proven techniques for development and testing, and the analogue parts of the circuit which are difficult to represent with said logic device can be implemented in discrete form on the programmable design tablet means. In addition standard interfacing parts, such as photodiodes, speed sensors for electric motors, may be coupled to ports of the design tablet means in order to provide appropriate interfacing with the external world.

In a further preferred feature of invention, a set of "kit parts", namely a set of integrated circuits embodying standard analog and interface functions such as operational amplifiers, level translators are provided for plugging in to the design tablet for implementing various standard functions. The advantage of using such kit parts as opposed to using commercially available integrated circuits is that the voltage levels etc. for the kit parts will be common to all the kit parts and thus the programming of the design tablet device to the appropriate signal levels is simplified. As preferred, the kit parts are formed from ASICs formed by a current mode logic (CML) process. Since the output of the machine according to the invention is a set of instructions for implementation into an ASIC of similar construction, the design of the circuit is simplified by the use of such kit parts and reduces the scope for error.

The digital functions implemented by the logic device and the kit parts have appropriate schematic symbols contained in the graphics design means in the processor. These are selected and interconnected on the processor display by a circuit designer to implement the chosen circuit function. This graphic information is then transcribed into a net list by an industry standard graphics software package. This net list is then processed into a data format comprising a set of coded instructions for downloading into said logic device and design tablet device.

As preferred, the logic device comprises a set of programmable logic modules. In each module there is an array of different types of gates, for example NOR gates with various numbers of inputs, various types of flip-flops, and various multiplexers and demultiplexers. The multiplexers serve to route the inputs and outputs of the various gates to an interconnection bus for a particular programmable logic module. Each module is implemented on a single integrated chip in the preferred embodiment. Each module is programmable to select a particular configuration of gates present within the module.

There is also provided a set of programmable switch modules each of which contains multiplexers to enable selective interconnection of the interconnection busses of the programmable chip modules. As preferred, the switch modules provide a hierarchical interconnection of busses, a first level being a bus for local interconnection between individual logic modules, and a second and further levels are provided for interconnecting the logic modules to increasing numbers of switch modules whereby eventually to provide a wide bus (for example 64 bits wide) which couples all the switch modules and all the logic modules to the design tablet device.

As preferred, the coded instructions for programming the logic device and the design table device are received from the processor via a suitable port, for example RS232 and the coded instructions are clocked into the logic modules and switch modules by a controller circuit within the logic device.

Although in a preferred embodiment the design tablet means and logic means are separate elements, they may in some circumstances be integrated into a single physical module.

BRIEF DESCRIPTION OF THE DRAWINGS

A preferred embodiment of the invention will now be described with reference to the accompanying drawings wherein.

DETAILED DESCRIPTION OF THE PREFERRED EMBODIMENTS

Figure 1:
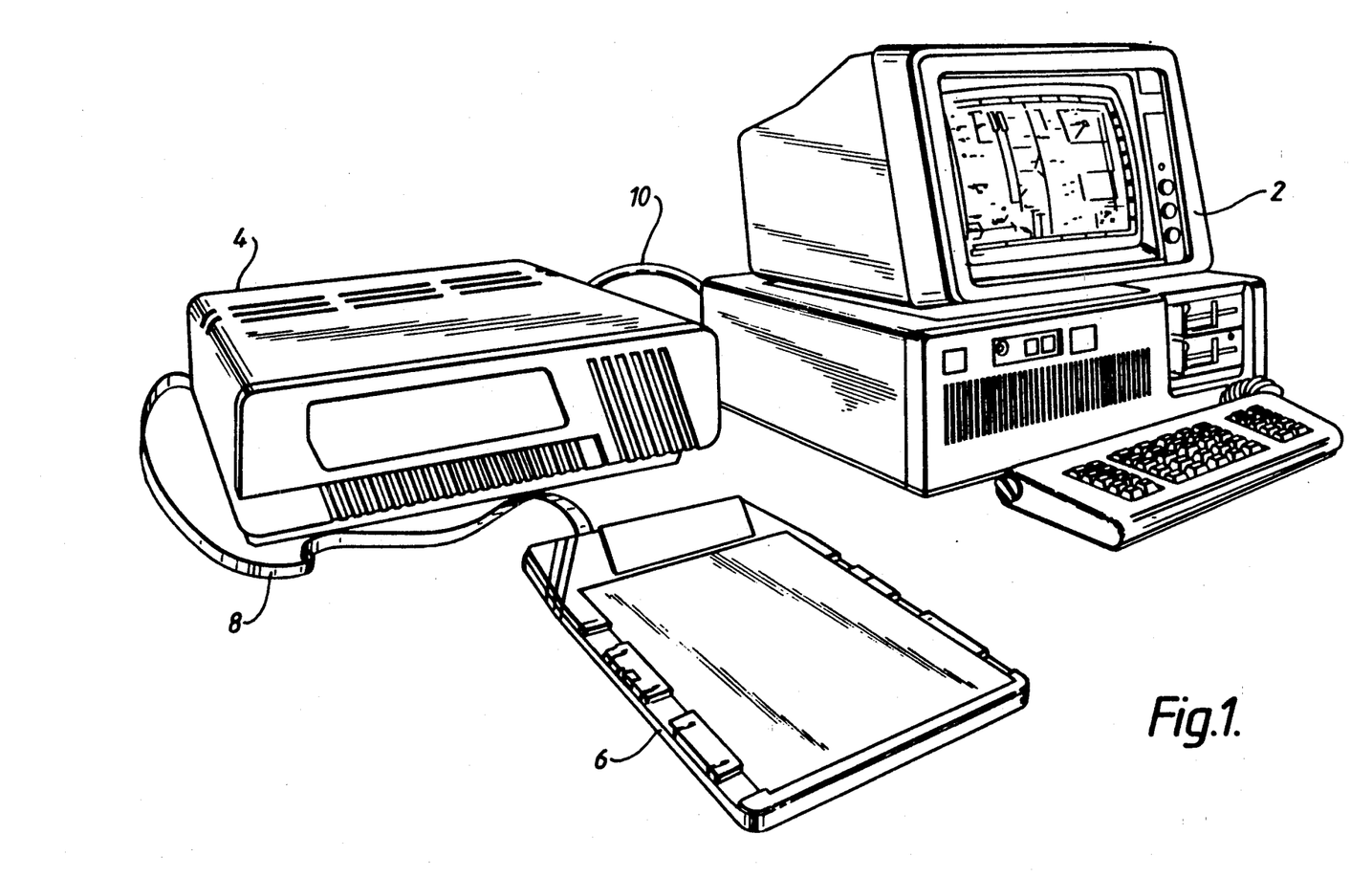
FIG. 1 is a perspective view of the circuit design machine according to the invention.

Referring now to the drawings, the machine as shown in FIG. 1 comprises a personal computer 2, a logic device 4 and a design tablet device 6, the devices 4 and 6 being interconnected by a ribbon cable 8 forming a 48 bit wide bus. PC 2 is connected to logic module 4 by an RS232 interface, the cable of which is shown at 10.

PC 2 has various software programs loaded therein, one of which is a schematic capture package which provides in graphical form on the display a full range of gates, logic macros, digital interfaces and linear building blocks which are presented on the display in symbolic form. These can be called up from a library store in order to assemble the system display on the screen, in well known manner. Thus the symbols are selected and interconnected by the circuit designer with the aid of a graphics software package to implement the chosen circuit function. This graphic information is then transcribed into a net list by an industry standard graphics software package (for example ESP). A net list is a list of the nodal connections to be made between the various circuit elements in order to form from the hardware within the logic module and the design tablet, the circuit function. This net list is processed into a data format suitable for downloading into logic device 4. The data format of the net list is communicated to the logic device 4 by means of the RS232 connector 10.

Figure 2:
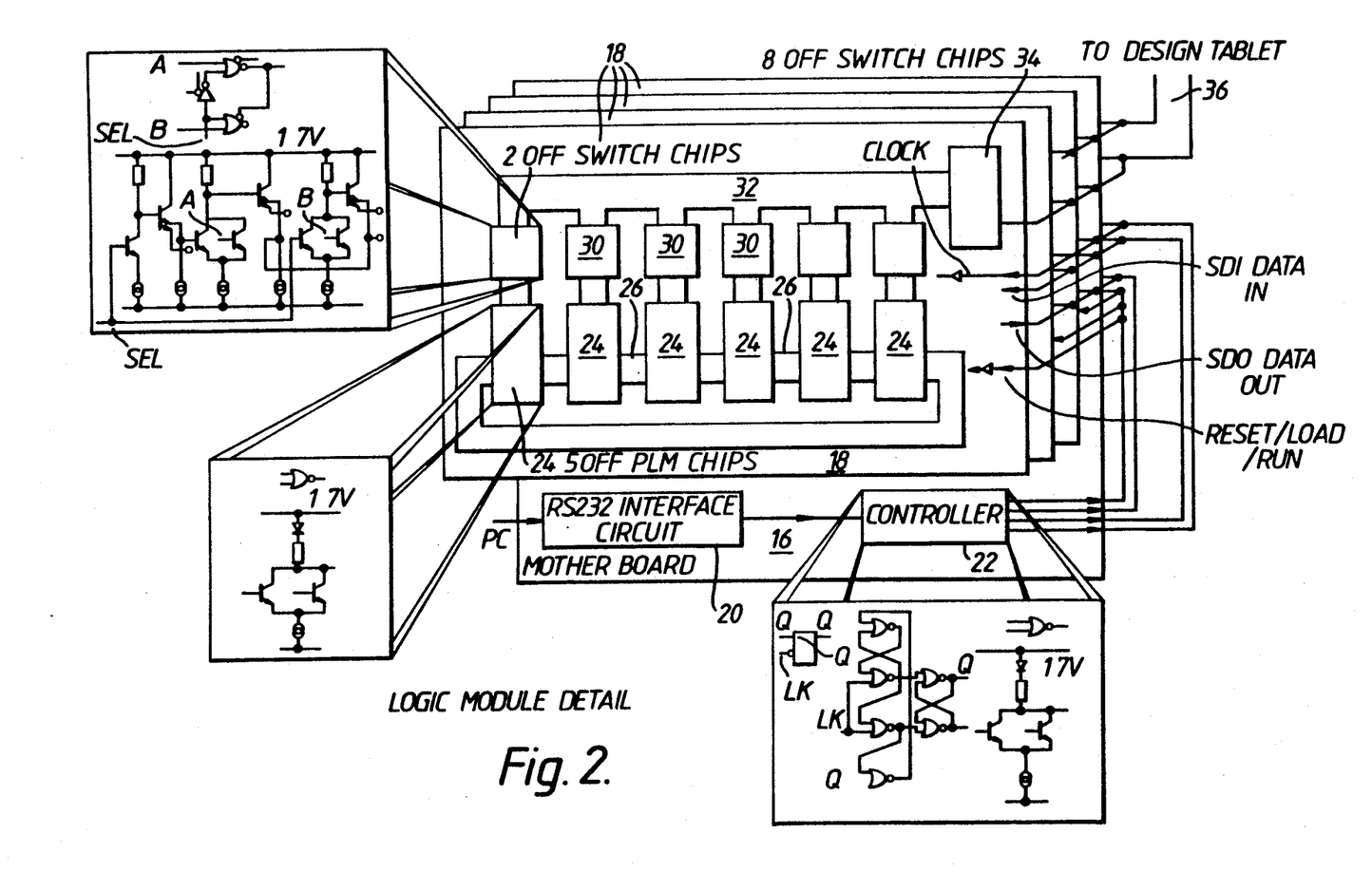
FIG. 2 is a block schematic diagram of the logic device according to the invention.

Referring to FIG. 2, a schematic block diagram of the circuit boards present in logic device 4 are shown. Logic device 4 consists of a motherboard 16 and three identical daughter boards 18. Each daughter board contains a set of 50 customised gate arrays to implement the required logic function. The motherboard contains an identical set of gate arrays, but it also contains an RS232 interface 20, battery backed RAM and a master controller IC 22. The RS232 interface is used to receive information from PC and store it in the RAM. The controller transfers this information into the rest of the boards to set the gate arrays into the correct state to correctly model the desired logic function; this transfer is done in the form of a serial data stream. The three daughter boards are connected to the motherboard via two 50 way ribbon cables which provide the main 64 way global data bus. There is also a small group of control lines connected to each board. The first 48 lines of the 64 way global bus are also connected externally to the design tablet via ribbon cables to enable external interfacing. The remaining 16 lines plus 48 of the internal signal lines from the motherboard cards are taken to a test socket to allow these lines to be monitored externally.

The three daughter boards 18, each have six different sets of programmable logic modules 24, each set 24 comprising five separate TTL integrated circuit chips. The module sets are interconnected by a 4 bit wide bus 26. Each module set is connected via a 16 bit wide bus 28 to a switch chip module 30 comprising two integrated circuit chips. Switch sets chip module 30 comprising two integrated circuit chips. Switch sets 30 are connected via a 48 bit wide bus 32 to a further switch set 34 comprising eight separate integrated circuit chips. A 48 bit wide bus 36 is provided from switch set 34 to the design tablet 6.

Figure 3:
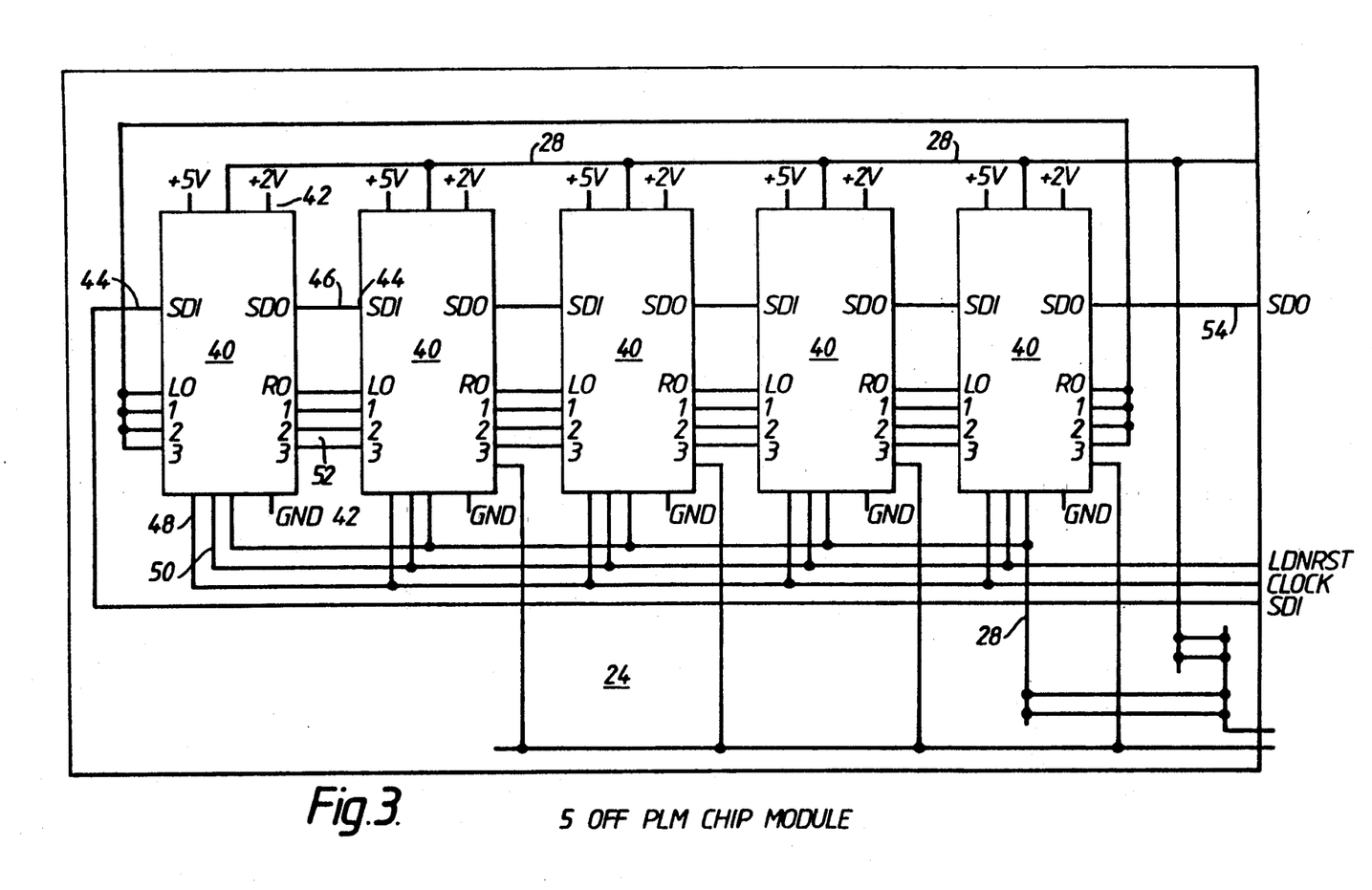
FIGS. 3, 4A, 4B, 4C, 5 and 6 are more detailed functional block diagrams of the switch modules and programmable logic modules of FIG. 2.

Referring to FIG. 3, the five different chips of a programmable logic module 24 are shown in more detail. Each chip 40, has power supply inputs and ground inputs 42, a serial data in input (SDI) 44 coupled to controller 22, a serial data output (SDO) 46 coupled to the SDI input 44 of an adjacent PLM chip 40, a clock input 48, a system reset input 50 and a 4 bit wide signal bus 52 which interconnects adjacent 40. Thus the chips 40 of each module set are connected in daisy-chain fashion with serial data being clocked in to the first chip of the daisy-chain in order to set up the various gates present in the module 40 for operation in the designed circuit. Selected lines of the bus 52 are energised in order to interconnect appropriate gates of neighbouring chips. The setting up data is fed through the chips in daisy-chain fashion and links to a serial data out bus 54 which is connected back to controller 22.

Figure 4A:
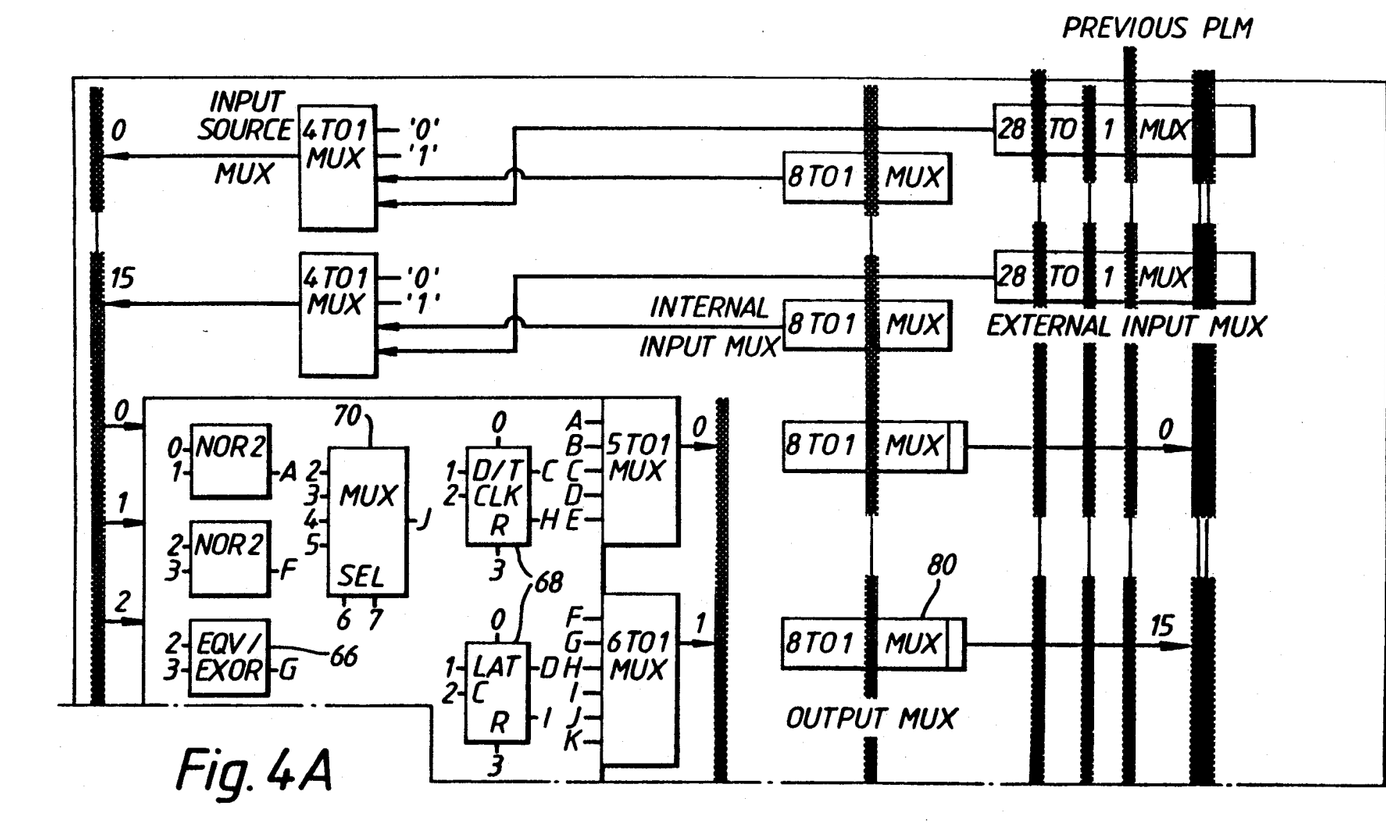
Figure 4B:
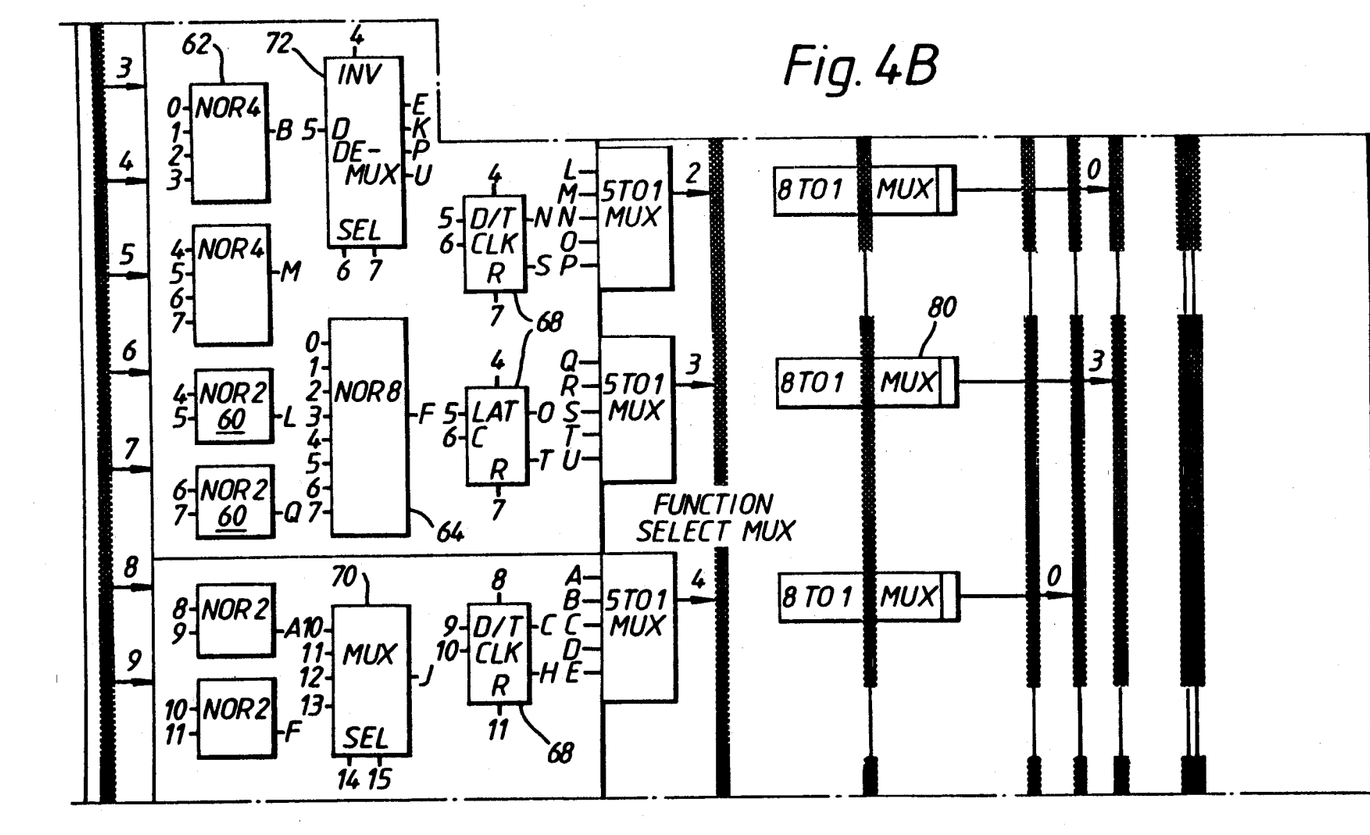
Figure 4C:
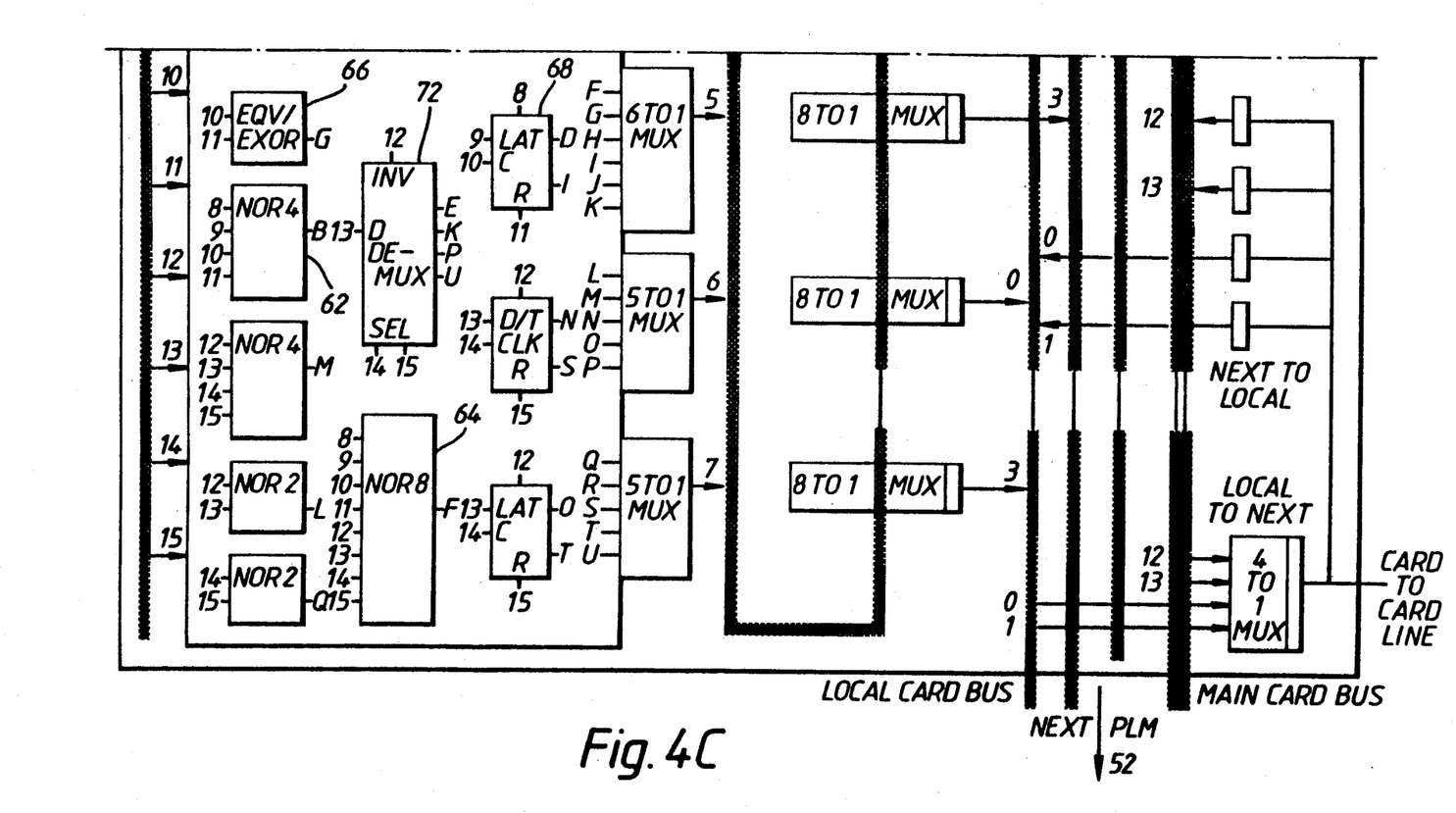

The gates present in each module 40 are shown schematically in FIGS. 4A, 4B and 4C taken together. All of the gates and circuits comprise a variety of NOR gate based functions in TLL logic that are selected to implement the chosen logic function by selection and capture on PC2. The gate functions comprise: two input NOR 60, four input NOR 62, eight input NOR 64, exclusive OR 66, latches 68, multiplexers 70 and demultiplexers 72. Unused inputs on the two, four, eight input gates and D-latch, D-type and T-type can be logically disabled to simplify the function required. Once selected, the input and output of the chosen gates are routed to the interconnection bus 52 by on-chip multiplexers 80. In addition these multiplexers interconnect and 16 bit wide bus 28 which is coupled to all modules 40 to a respective two element switch set 30 which is shown in more detail in FIG. 5.

Figure 5:
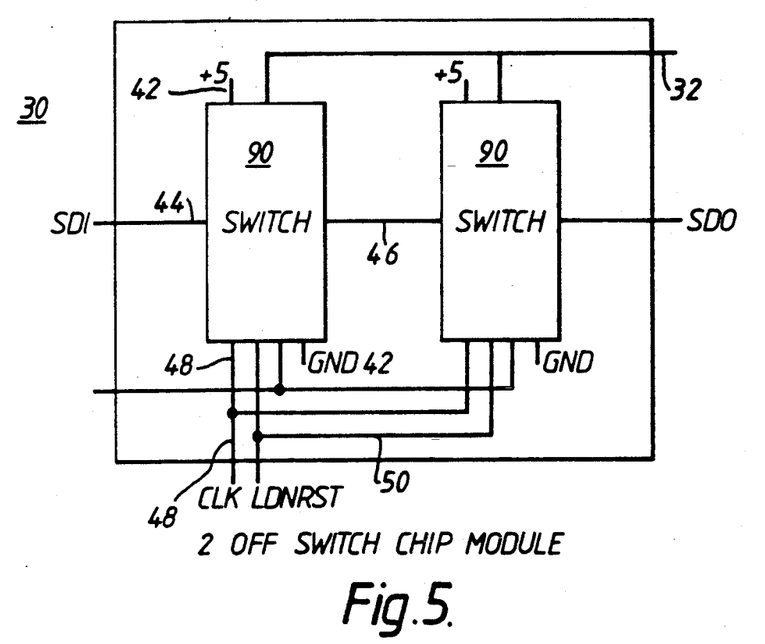

Referring to FIG. 5 this shows a switch chip module 30 comprising first and second integrated circuit switch chips 90 having the 16 bit bus 28 coupled thereto and a 48 bit wide bus 32, with bits 0 to 23 of bus 32 being coupled to the first switch chip 90, and bits 24 and 47 of bus 32 being coupled to the second chip 90. As with PLM chips 40, appropriate SDI, SDO, clock, reset, power supply and ground ports are provided indicated by the same reference numerals used in FIG. 3. The contents of each switch chip 90 is a set of multiplexers which couple bits of bus 28 to selected bits of bus 48 to achieve desired interconnection patterns.

Thus the logic module 4 implements the logic portion of the system design with gates integrated within a set of specially designed ICs. These ICs also contain a system which allows the automatic interconnection of the gates. The gates in the module 4 will correspond, on a one-for-one basis, to gates in the schematic display on PC 2, ensuring no problems can occur with the generation of Boolean equivalents for functions.

Figure 6:
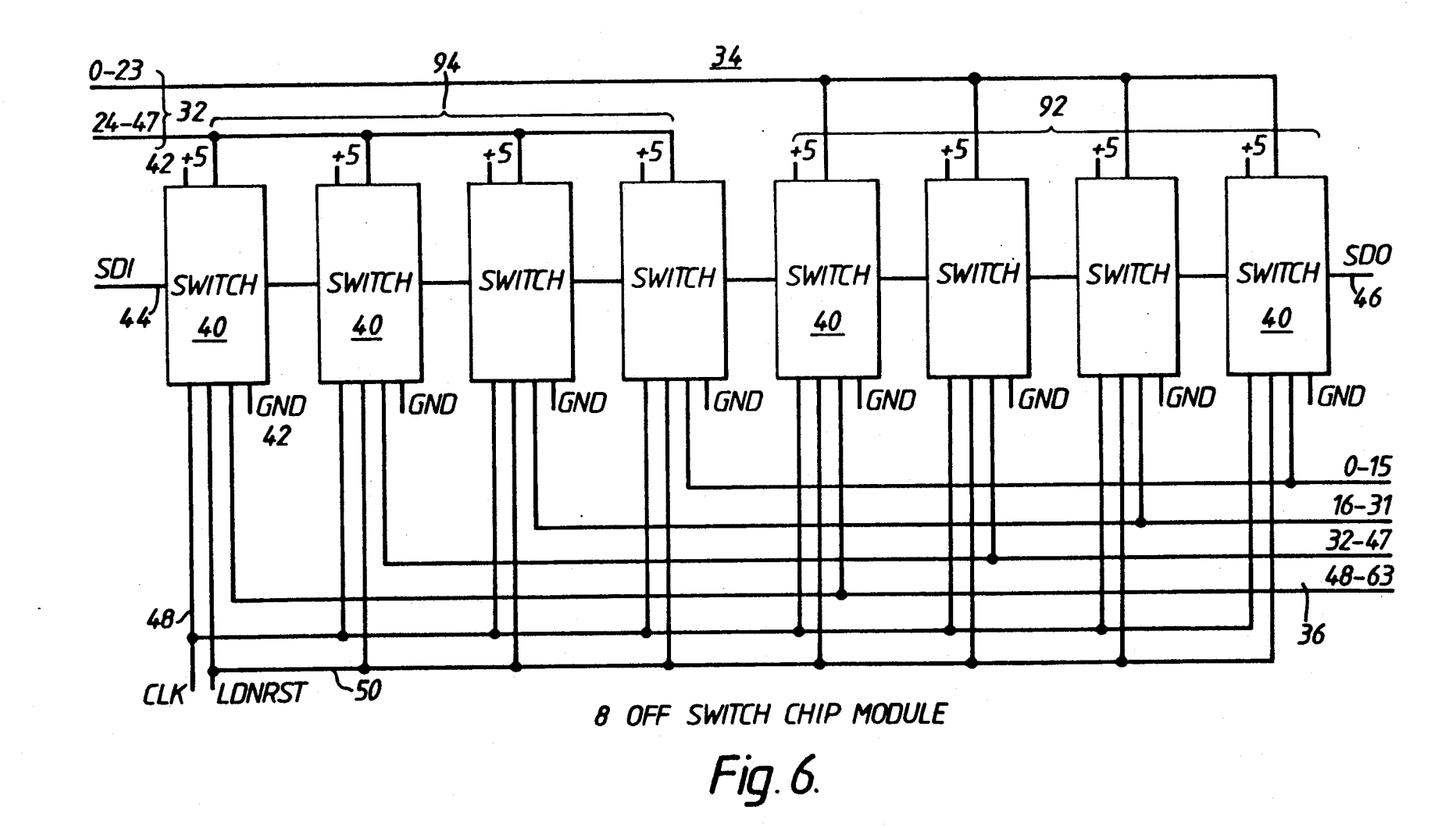

Referring to FIG. 6 this shows switch set 34 in more detail as comprising eight switch chips 40, each of which is identical to the chips shown in FIG. 4 as so the reference numerals are used to indicate similar parts. The 48 bit wide bus 32 is divided up so that bits 0 to 23 are fed in parallel to a first set 92 of four chip modules 40 and bits 24 to 47 are fed to a second set 94 of four chips 40. The 16 bit wide busses of the chips are interconnected as shown in order to provide a 64 bit wide output bus 36.

Thus there are four levels of bus hierarchy in the logic module. The first level is a 4 bit bus 52 used for local interconnect between individual PLM chips within a set of five PLM chips. The second level is a 16 bits wide bus 28 and connects each PLM chip of a module to a pair of switch chips 30. The third level is a 48 bits wide bus 32 and connects each switch chip module 30 to an eight switch chip module 34. The fourth level is a 64 bit wide bus 36 connecting all four sets of eight switch chips. The top 48 bits of this bus 36 connect to the design tablet.

Figure 7:
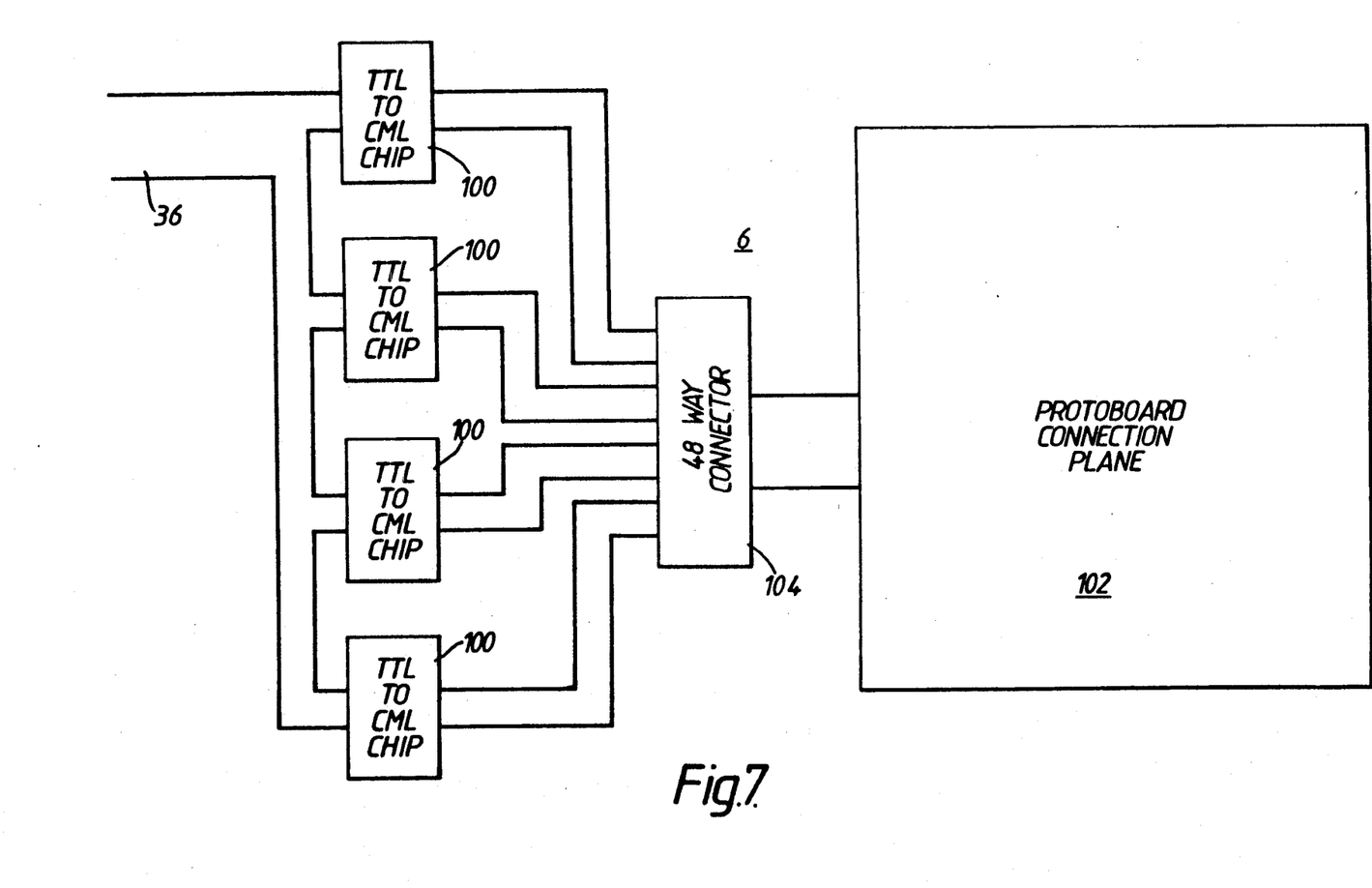
FIG. 7 is a functional block diagram of the design tablet device of the invention.

Referring now to FIG. 7 this shows a schematic block diagram of the design tablet 6, as comprising four chips 100 each of which accepts as an input 12 bits of the 48 bit wide bus 36 and converts the logic levels from the TTL levels employed in logic module 4 to common mode logic (CML) levels of one volt used in the plug board assembly 102. A 48 way connector 104 connects chips 100 to the connection plane 102 of the plug board.

Figure 8:
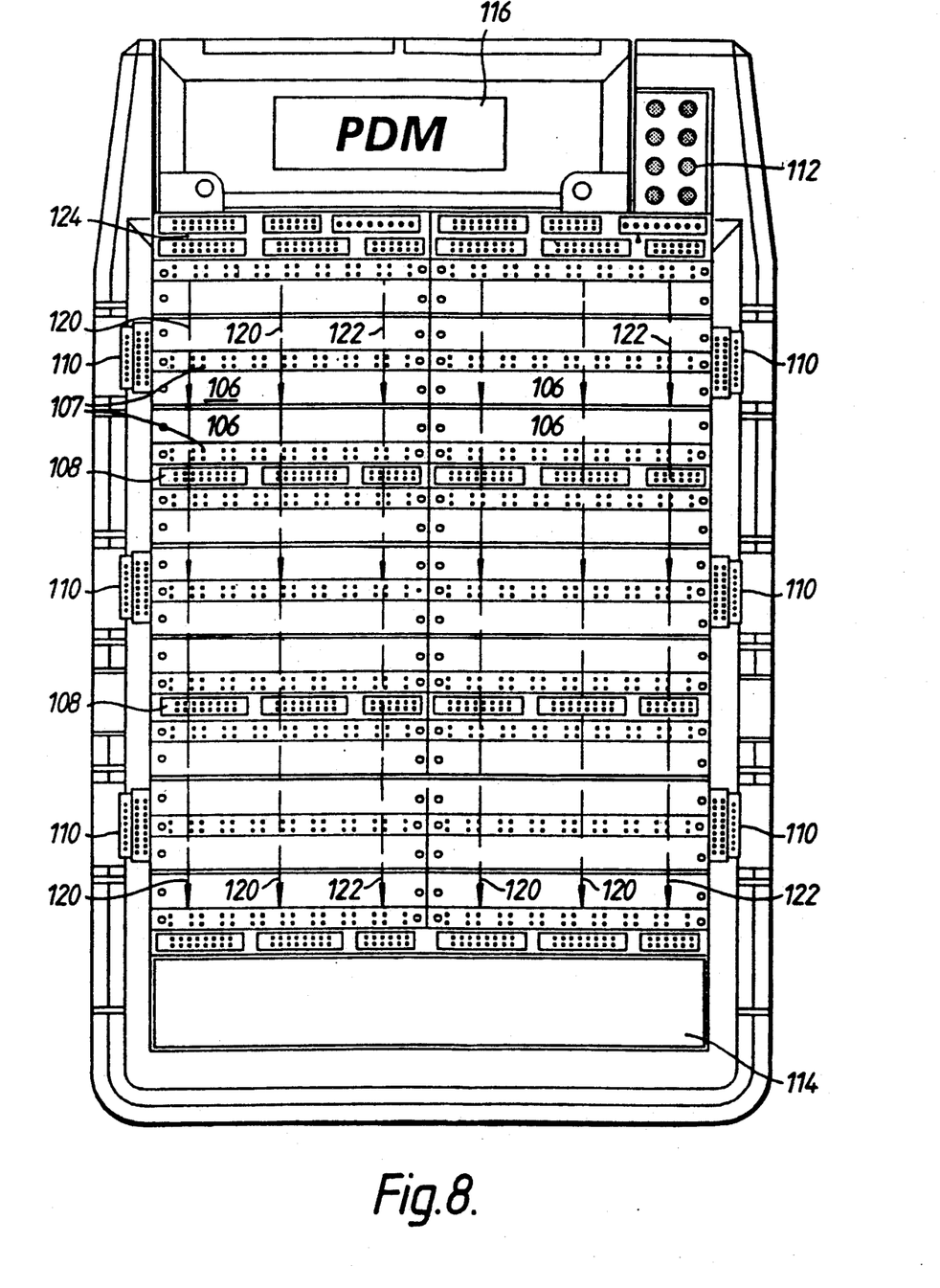
FIG. 8 is a schematic top perspective view of the design tablet device showing the various parts of the design tablet; and, FIGS. 9A and 9B show the outline and specification respectively of an operational amplifier formed as a kit part for connection into the design tablet.

Referring now to FIG. 8, the design tablet is shown in more detail. The tablet includes plug boards 106 of known construction, wherein electrical components may be snap fitted by means of wires or terminals inserted into the socket apertures 107 in the plug boards 106 to make connection with buses in the connection plane 102. Selected busses of each plug board are connected to selected lines of the bus 36 and the manner of the inconnection will be made apparent to a user either in reference manual or in the video display on PC2. In addition, further plug boards are provided as at 108 which are provided to permit access to internal bus lines 120. Various external connectors are provided for connecting external interface units: thus screw terminal connectors 110 are provided coupled to selected lines of the plug boards and parallel boards and plug in terminal connectors 112. Standard switch modules or displays 114 are provided. Switches for setting the directions of various signals in ribbon connector 8 are provided.

The lines between the logic module 4 and design tablet 6 are bidirectional bus lines and enable the connection between the digital part of the design and the linear macros and interfaces. The direction of signals on the cables is automatically set at the logic module end, but at the design tablet end it must be set by means of small switches located on the interface module at the top of the tablet at 116.

There are two 16 way busses 120 which run vertically the full length of each set of boards. These lines are accessible on smaller plug-in boards 108 which fit between each group of boards 106, and also at the top and bottom. These are intended to be used for signals which need to connect across any distance on the tablet, in order to avoid long wires and to encourage ordered design. Hook-up wire will be used to connect from the required connection point on the protoboard to the desired bus line.

These 32 lines are designed for signals, and have been laid out to give minimum coupling with adjacent lines by using narrow traces on the PCB to which they are all attached.

There is also an 8 way bus 122 designed for power rails.

The vertical bus lines are also accessible at 124 adjacent to the interface modules which connect back to the logic module.

A group of 4 mm terminals 112 is provided at the top of the tablet to enable easy connection to power supplies. These terminals are permanently connected to the two vertical power rail busses.

The vertical bus lines are available at the bottom edge of the tablet, where a facility 114 has been included to fit modules with switches, potentiometers, displays etc. These modules can be easily connected to the required bus lines. Blank modules can be supplied.

Positioned down each side of the tablet are a number of screw terminal connectors 110 which attach to small plug-in boards. These can be used to provide connection to external components such as relays, motors etc. They are particularly suited to noisy or high current devices, avoiding connection onto the main busses.

It is a feature of the present invention that various types of analogue units and interface units which will commonly be employed in linear analogue circuits are provided with the system according to the invention as a set of integrated circuit chips which may be plugged in to the plug boards. These chips are formed as dual-in-line (DIL) packages and as preferred the chips are formed of common mode logic from uncommitted logic arrays with an operating voltage of around one volt.

Figure 9A:
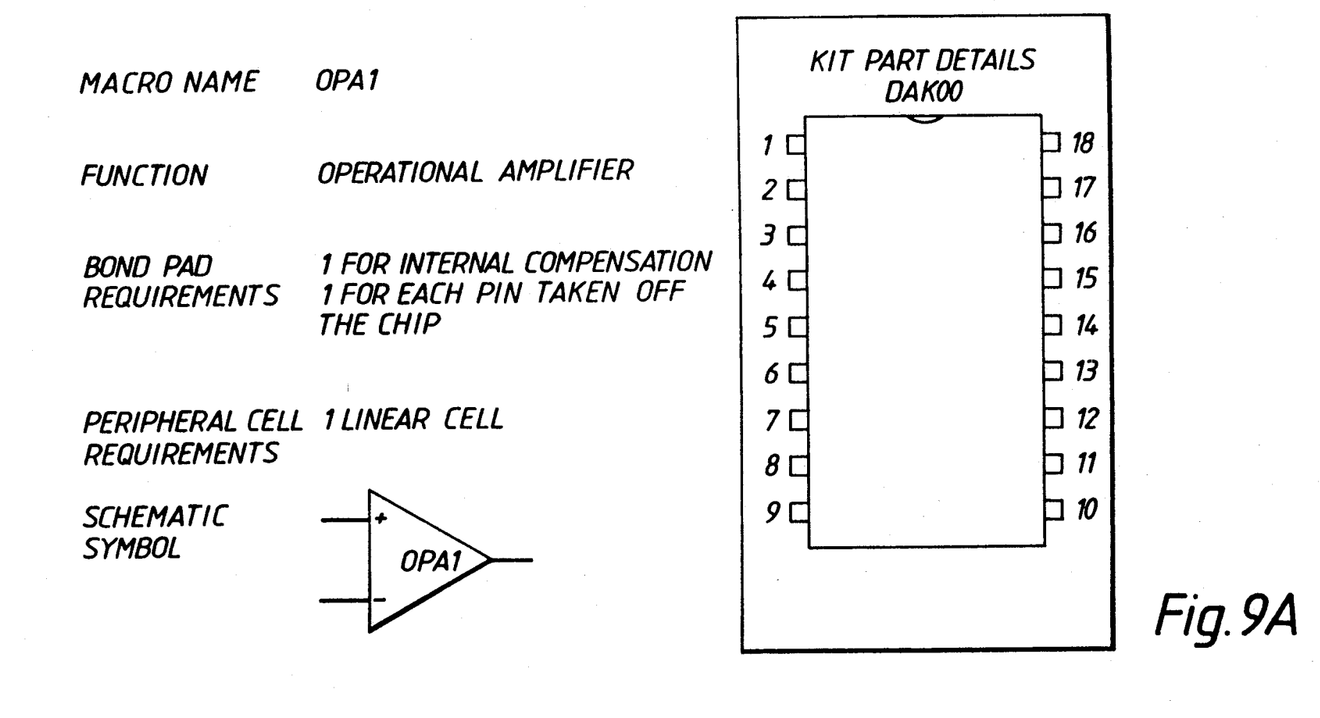
Figure 9B:
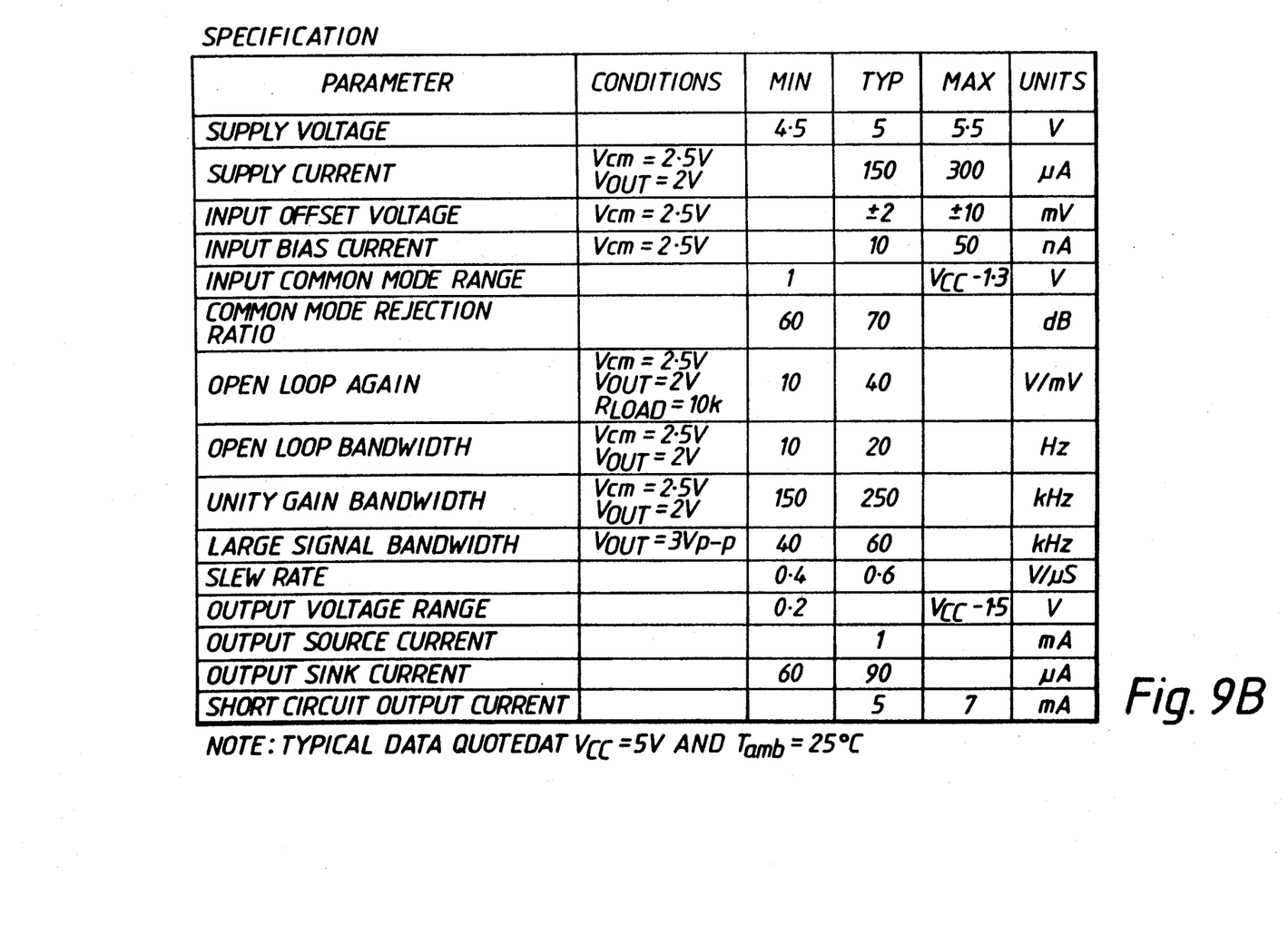

FIG. 9A shows a kit part comprising an operational amplifier formed from an uncommitted logic array and having the specification indicated in FIG. 9B. Naturally a reference manual is supplied with the system which details these various chip kit parts and these kit parts are present in the software packages in PC2 so that they can be symbolically represented and incorporated into the circuit design.

All the interface and linear macros have been implemented in silicon and are available as macro kit parts, generally in 18 pin DIL packages. The relevant macro kit part for the chosen interface or linear function must then be fitted to the design tablet and connected to the assigned channel from the logic module.

The macro kit parts require a power supply, and this can be fixed external supply connected via the 4 mm terminals, or if an on-chip regulator is intended to be used in the final device, an unregulated supply can be provided and the suitable regulator macro connected to power the rest of the tablet. All the ground and power rails should be connected on the used macros.

External connections to components such as temperature sensors, pressure transducers, switches, LED and LCD displays, motors etc. can be made either from the small plug-in modules on the linear board, or from the screw terminal connectors provided down each side. Interfaces at high currents should ideally be connected via the screw terminal connectors positioned on the sides of the board.

In operation of the system according to the invention, a full range of gates, logic macros, digital interfaces and linear building blocks are available as symbols on the PC schematic capture package. These can be called up from the relevant library in order to assemble the system design on the screen.

The signals which connect between the digital functions and the linear macros are the signals which must pass between the logic module and the design tablet. These are assigned channel numbers, (either automatically or manually,) on the logic diagram. Hence, these are channels to which the linear macros must be connected on the design tablet.

Once the information has been downloaded, it is transferred to the rest of the ICs in the system and a signature analysis is performed and compared with the signature supplied from the PC. The logic module can be operated in isolation from the PC once a valid circuit has been downloaded, and when the module is turned back on it will automatically transfer the information to the ICs and recheck the signature analysis. If an error is detected in the signature, a fault light will register and the PC will be automatically notified.

The schematics are netlisted, and the conversion program is run to divide the logic into sections which can be implemented in the ICs in the digital box. This information is downloaded to the digital box via the RS232 link. The relevant channel number for each of the interface lines between the logic module and design table needs to be noted, along with its direction. The ribbon cables which connect between the two should initially be disconnected.

The direction of each interface line to the logic module is set on the switches 114 located in the small interface module at the top edge of the tablet. Once these have been set, the ribbon cables can be connected.

A multi-way test socket is available at the rear of the box to enable selected internal logic nodes to be brought out to assist in the de-bugging of the digital part of the design. The points of interest will be identified in the schematics on the PC display, and the relevant pin number on the test socket will be provided.

The full system can now be operated and its performance assessed. In order to assist with the analysis of the logic part of the design, internal nodes can be made accessible on a test socket at the rear of logic module by identifying the relevant point on the schematics. All the linear circuitry is readily accessible on the design tablet to enable connections to oscilloscopes, DVMs etc.

If modifications are required, the schematics can be readily changed on PC2, the new interconnection downloaded, and the design tablet 6 corrected if necessary.

The schematics are the reference for the design and if changes are made to the design tablet the corrections must also be made to the schematics. Any changes to the digital section can only be made by modifying the schematics.

Once the full system has been proven, the netlist which contains the information about the whole device (digital, linear and interface) can be transferred to a Semiconductor house who will rapidly implement the design in silicon. The digital portion of the design is autorouted on the central matrix of the suitable DA array, followed by the interactive placement of the standard linear and interface macros in the peripheral region. Correct connectivity between the digital and linear sections is thus ensured. The standard macro patterns are identical to those used in the macro kit parts, and since the design has been verified using real silicon implementations of the macros, the final silicon should work first time.

Thus, it may be seen from the above the machine according to the invention solves the problem of fast, low cost development and demonstration of mixed analogue and digital integrated circuit design.

Having captured the design on an industry standard personal computer using library elements, the design description is down loaded to the machine according to the invention and the connections automatically made. Digital and analogue interface functions are inserted using off the shelf library kit parts.

The system peripherals—sensors, displays, motors—can then be connected and the design evaluated.

Design modifications is a simple task, done by inserting different kit parts and modifying the description in the p.c.

The concept is aimed at design with a range of gate arrays, but can be extended to other mixed analogue and digital designs and even used as a valuable educational aid.

The aim of the machine according to the invention is to enable quick and convenient verification of a mixed analogue and digital integrated circuit design by hardware means.

It is primarily aimed at design verification of a range of gate arrays that include, on the Collector Diffusion Isolation process technology, both npn and pnp transistors.

The market for such gate arrays is almost entirely consumer, covering all market application areas, but at low frequencies of operation, perhaps battery operated. Examples are infra red detectors for burglar alarms, camera control circuits, electronic toys and portable instrumentation.

It is intended that the machine according to the invention will enable customer design and development of a mixed analogue and digital IC design. There are only two current techniques for proving a mixed design. The first is by breadboarding using standard components/special kit parts.

This has the disadvantage of being very time consuming and results in a solution that has neither the flexibility or the performance of the finished semi custom product.

The second solution is to simulate the system in software using a hardware description language that is capable of behavioural modeling. Few current programs are available. All are relatively expensive and require a microcomputer to run them on. This option has the disadvantage that the external peripherals to the system cannot be attached to demonstrate full functionality.

The typical customer probably cannot afford a microcomputer, has little software expertise and would prefer not to breadboard his system at the gate and amplifier level. He is most likely, though, to have a personal computer.

By providing software libraries of the analogue and digital circuit functions, the design can be captured on a PC and then the connectivity of the circuit mapped automatically into the machine according to the invention by software. The digital function is implemented using each gate type. These are interconnected by on-chip multiplexers to perform the switching function.

The software selects the logic function required in each plm and implements the appropriate signal routing to other plms or the peripheral kit parts. These kit parts are plug in devices that contain the analogue and digital interface circuit building blocks. They are integrated on gate arrays and are fully characterised, general purpose circuits using complimentary devices.

Following insertion of the kit parts and download of the system design, the customer can connect his peripheral devices such as motors, lamps, displays, sensors etc. in order to be able to demonstrate his complete system.

Should the designer wish to modify the design, it would be a simple task to unplug a kit part and insert a new one, modify the design by editing the description in the pc and then re-downloading the connection pattern to the machine.

Use of the machine can be extended easily to model more complex mixed analogue and digital designs since it is built in a modular format.

We claim:

1. A machine for circuit design, comprising:
   a configurable logic device;
   a design tablet device;
   a processor;
   bus means for interconnecting said configurable logic device, said design tablet and said processor;
   said configurable logic device including a set of configurable circuit elements in integrated circuit form for providing a hardware representation of at least one logic circuit element;
   said design tablet device including a plug board for the connection to the machine of at least one discrete electrical analogue device;
   said at least one logic circuit element and said at least one discrete electrical analogue device forming respective parts of a simulation of a circuit being designed; and
   said processor including
      a display,
      graphics design means,
      means for providing digitally coded signals both to said configurable logic device to configure circuit elements thereof as said at least one logic circuit element, and to said graphics design means to effect for display a graphic representation of said at least one logic circuit element,
      means for effecting for display a graphics representation of said at least one discrete electrical analogue device connected to the plug board of said design tablet device, and
      means for applying signals to, and for receiving signals from, said at least one logic circuit element and said at least one discrete electrical analogue device to evaluate the design and performance of the simulated circuit.

2. A machine according to claim 1 wherein the design tablet includes plug board sections providing selective electrical connection to bus lines providing power rails.

3. A machine according to claim 1 wherein the design tablet includes screw terminal connectors for connection of external units for interfacing with the outside world.

4. A machine according to claim 1 including a group of terminals for connecting external units to power supply bus rails provided within the design tablet.

5. A machine according to claim 1 wherein a set of switches are provided for selecting the direction of interconnection of the various lines of a parallel bus interconnecting the logic device and the design tablet device.

6. A machine according to claim 1 wherein the processor is arranged to provide a set of instructions for converting the circuit designed by means of the machine to an integrated circuit formed from an uncommitted logic array.

7. A machine according to claim 1 wherein the logic device is coupled to the processor by means of an interface for receiving coded instructions, and the coded instructions are received in a memory means in a controller device within the logic device.

8. A machine according to claim 7 wherein the controller is connected to the programmable circuit elements of the logic device by means of a data line in daisy-chain fashion.

9. A machine according to claim 1 wherein the programmable circuit element of the logic device are formed in TTL logic.

10. A machine according to claim 9 wherein said design tablet device is connected via a parallel bus to said logic device and a design tablet device includes interface means for converting TTL voltage levels to common mode logic levels.

11. A machine according to claim 1 including a plurality of kit parts, each kit part comprising an integrated circuit providing a circuit function and being formed as a package for plugging into said plug board.

12. A machine according to claim 11 wherein each of said kit parts is formed from an uncommitted logic array in current mode logic.

13. A machine according to claim 11 wherein the graphics capability of said processor includes a library of symbolic representations corresponding to the various possible representations of said circuit elements of said logic means and said kit parts.

14. A machine according to claim 13 wherein said graphics capability includes means for compiling the symbolic circuit representation formed on said display to a netlist and then converting said netlist to a set of coded instructions for the setting of the logic device and the design tablet device.

15. A machine according to claim 1 wherein the logic device includes a set of programmable logic modules, each logic module comprising one or more integrated circuits containing an array of different types of gates which may be selectively activated by said coded instructions.

16. A machine according to claim 15 including a parallel bus interconnecting said programmable logic modules and being selectively actuated by multiplexer means present in each programmable logic module.

17. A machine according to claim 15 wherein each programmable logic module is coupled to a switch chip module by means of a second parallel bus, and wherein each first switch chip module is connected by a third parallel bus, wider than said second parallel bus, to a second switch chip module, the arrangement being such as to provide selective interconnection between the programmable logic modules, and each switch chip module comprising a set of multiplexers to provide selective interconnections between the second and third busses.

18. A machine according to claim 17 wherein said second switch chip module interconnects said third bus to a fourth parallel bus providing interconnection between the logic device and the design tablet device.

* * * * *